United States Patent
Mai-Krist et al.

(10) Patent No.: US 9,504,174 B2
(45) Date of Patent: Nov. 22, 2016

(54) ELECTRICAL CONNECTOR FOR ATTACHMENT TO VEHICLE GLASS

(71) Applicant: A. Raymond Et Cie., Grenoble (FR)

(72) Inventors: Ida Tem Mai-Krist, White Lake, MI (US); Jeffrey Hugh Moser, White Lake, MI (US); Peter Ziereisen, Rochester Hills, MI (US)

(73) Assignee: A. Raymond Et Cie, Grenoble (FR)

( * ) Notice: Subject to any disclaimer, the term of this patent is extended or adjusted under 35 U.S.C. 154(b) by 0 days.

(21) Appl. No.: 14/416,294

(22) PCT Filed: Aug. 8, 2013

(86) PCT No.: PCT/US2013/054124
§ 371 (c)(1),
(2) Date: Jan. 22, 2015

(87) PCT Pub. No.: WO2014/025991
PCT Pub. Date: Feb. 13, 2014

(65) Prior Publication Data
US 2015/0208533 A1 Jul. 23, 2015

Related U.S. Application Data

(60) Provisional application No. 61/681,263, filed on Aug. 9, 2012.

(51) Int. Cl.
H01R 33/00 (2006.01)
H05K 5/02 (2006.01)
H01R 12/70 (2011.01)
H05B 3/08 (2006.01)
H01R 4/00 (2006.01)
(Continued)

(52) U.S. Cl.
CPC .............. *H05K 5/0247* (2013.01); *H01R 4/00* (2013.01); *H01R 4/02* (2013.01); *H01R 12/57* (2013.01); *H01R 12/7041* (2013.01); *H05B 3/08* (2013.01); *H01R 2201/02* (2013.01); *H01R 2201/26* (2013.01)

(58) Field of Classification Search
USPC .................................................... 439/34, 329
See application file for complete search history.

(56) References Cited

U.S. PATENT DOCUMENTS 6,702,619 B2 * 3/2004 Kuroda ................ H01R 12/716
439/637
6,710,239 B2 * 3/2004 Tanaka .............. H01L 31/02242
136/244
6,942,495 B2 * 9/2005 Liao ................... H01R 13/2435
439/66

(Continued)

*Primary Examiner* — Tho D Ta
(74) *Attorney, Agent, or Firm* — Thomas T. Moga

(57) ABSTRACT

A connector for attachment to glass for connecting an electrically conductive substrate to an electric conduit is disclosed. The connector includes an electrically non-conductive housing having an interior region and an underside with a slot formed therein. The connector further includes an electrically conductive insert. The conductive insert has a contact portion that extends at least partially through the slot defined in the housing. A pre-applied, heat-activatable adhesive is provided on the underside of the housing for attaching the housing to the glass. The disclosed invention is provided in two embodiments, one that maintains conductivity between the substrate and the contact portion by a compressive force and one that maintains conductivity by lead-free solder. In the first embodiment, the contact portion includes a conductive skid extending therefrom. In the second embodiment, at least the contact portion of the conductive insert is coated with lead-free solder.

20 Claims, 6 Drawing Sheets

(51) Int. Cl.
   *H01R 4/02*      (2006.01)
   *H01R 12/57*     (2011.01)

(56) References Cited

U.S. PATENT DOCUMENTS

| | | | | |
|---|---|---|---|---|
| 6,997,756 B2 * | 2/2006 | Nakamura | ............. | H01R 13/41 439/733.1 |
| 7,059,884 B2 * | 6/2006 | Hisaeda | ................ | H01R 13/20 439/329 |
| 7,134,880 B2 * | 11/2006 | Arai | ................... | H01R 13/2435 439/66 |
| 7,247,047 B2 * | 7/2007 | Baranski | ............. | H01Q 1/1271 439/495 |
| 7,540,078 B1 * | 6/2009 | Suetsugu | ............. | H05K 1/0266 29/426.3 |
| 7,663,561 B2 * | 2/2010 | Hisaeda | ............ | B32B 17/10036 343/713 |

* cited by examiner

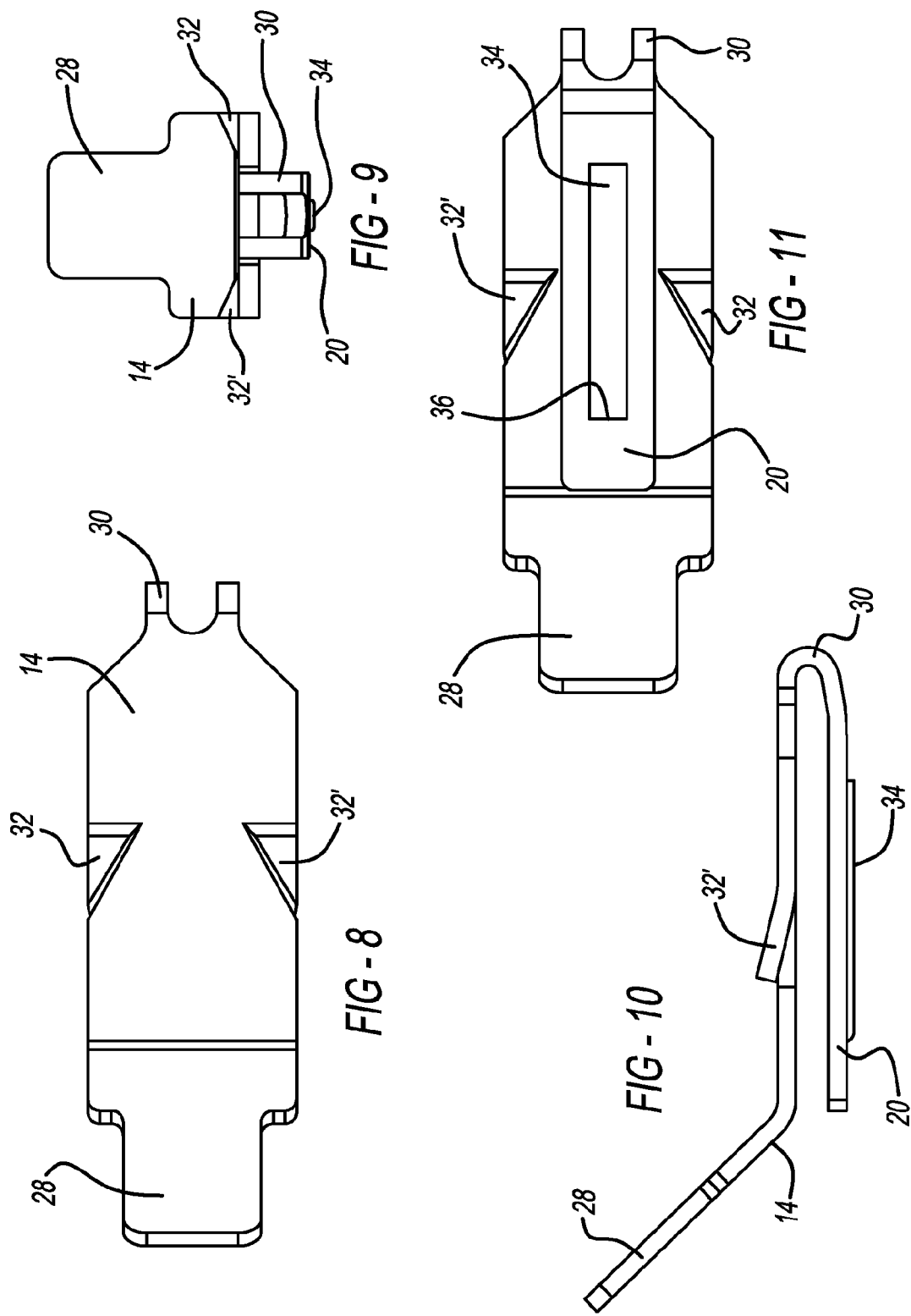

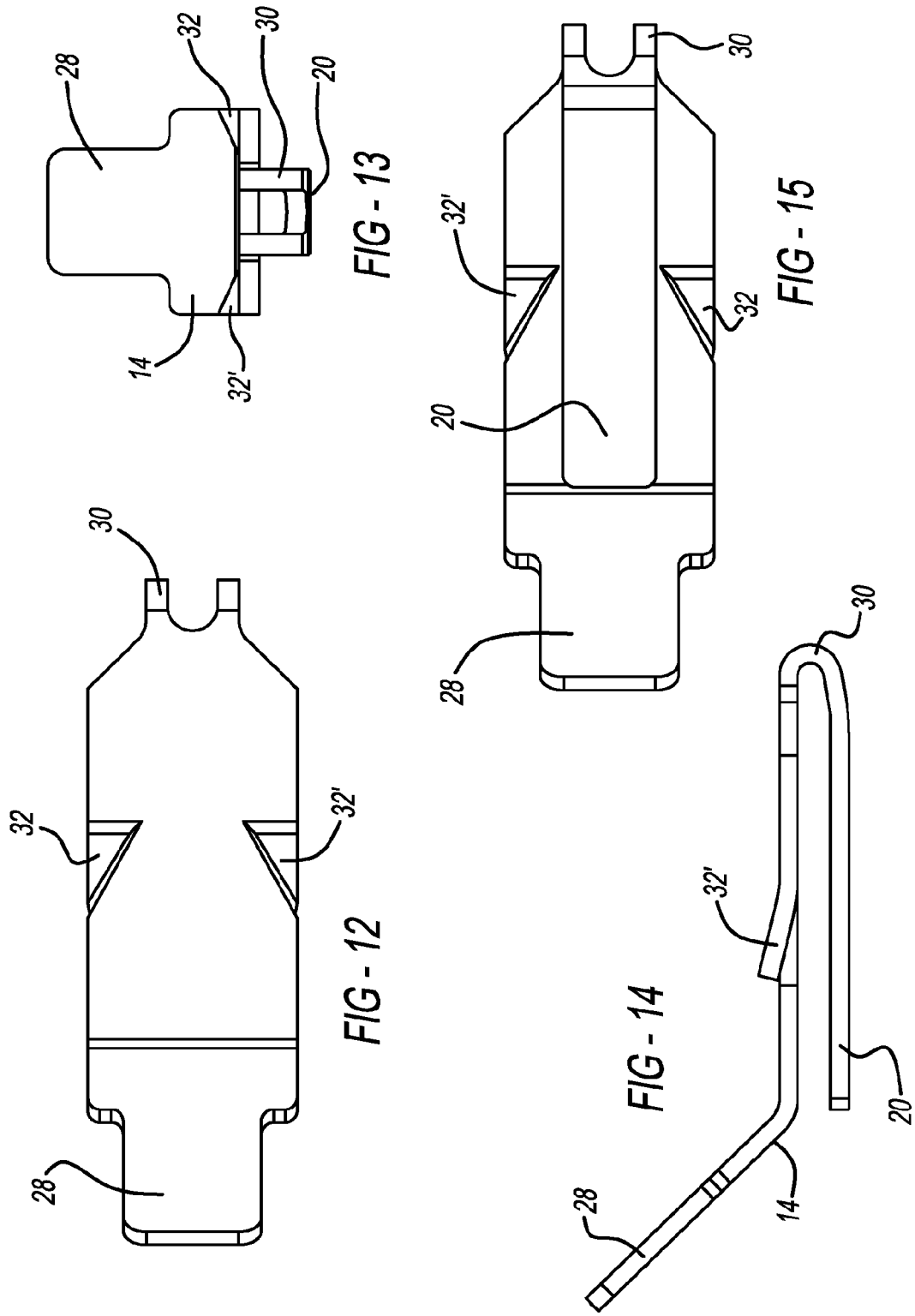

ELECTRICAL CONNECTOR FOR ATTACHMENT TO VEHICLE GLASS

TECHNICAL FIELD

The disclosed invention relates to electrical connectors for use with vehicles for attachment of an electrically conductive substrate to a power source. More particularly, the disclosed invention relates to a connector fixed to the glass surface by an adhesive that can provide electrical conductivity with or without the need for solder.

BACKGROUND OF THE INVENTION

The soldering of a connector to a glass surface in the automotive vehicle using solder-to-glass connectors in various vehicle applications has been known for some time. Common applications of solder-to-glass connectors include the connection of a power source to an electrically conductive substrate such as an ink that is placed and dried on the vehicle glass by any of several known methods. Typical vehicle applications include rear window defrosters and radio antennae. Other applications are known. In general, today's modern vehicle requires between two and four solder-to-glass connections.

Solder-to-glass connectors have traditionally used leaded solder to make a rigid connection. However, current and developing environmental regulations restrict the use of lead in most applications, including in solder. Without lead, the solder connection is not as durable as with lead.

Alternatives to the use of lead in solder have been attempted. For example, a common alternative is indium. While providing some of the strength characteristics of lead, commercially available lead-free solder formulations with indium exhibit low temperature melting points which can compromise the integrity of the joint at high temperatures.

Accordingly, as in so many areas of automobile technology, there is room for improvement in the area of solder-to-glass connectors.

SUMMARY OF THE INVENTION

The disclosed invention provides a connector for attachment to glass for connecting an electrically conductive substrate to an electric conduit. The connector includes an electrically non-conductive housing having an interior region and an underside. The underside has an outer surface and a slot formed therein. The connector further includes an electrically conductive insert for at least partial placement into the interior region of the housing. The conductive insert has a contact portion that extends at least partially through the slot defined in the housing. A pre-applied, heat-activatable adhesive is provided on the underside of the housing for attaching the housing to the glass.

The electrically conductive insert includes an upper portion and an intermediate portion connecting the upper portion to the contact portion, thus giving the electrically conductive insert a partial U-shaped configuration. A contact spade extends from an end of the insert. Spaced apart and opposed flanges extend from the upper portion of the insert to help retain the insert inside of the housing.

The disclosed invention is provided in two embodiments, one that maintains conductivity between the substrate and the contact portion by a compressive force and one that maintains conductivity by lead-free solder. With respect to the first embodiment, the contact portion includes a conductive skid extending therefrom. The conductive skid provides a compressive force against the substrate. With respect to the second embodiment, at least the contact portion of the conductive insert is coated with lead-free solder.

While exemplary embodiments in accordance with the invention are illustrated and disclosed, such disclosure should not be construed to limit the claims. It is anticipated that various modifications and alternative designs may be made without departing from the scope of the invention.

BRIEF DESCRIPTION OF THE DRAWINGS

For a more complete understanding of this invention, reference should now be made to the embodiments illustrated in greater detail in the accompanying drawings and described below by way of examples of the invention wherein:

FIG. 8 is a top view of a first embodiment of the conductive insert of the disclosed invention;

FIG. 9 is an end view of the first embodiment of the conductive insert of the disclosed invention;

FIG. 10 is a side elevational view of the first embodiment of the conductive insert of the disclosed invention;

FIG. 11 is a bottom view of the first embodiment of the conductive insert of the disclosed invention;

FIG. 12 is a top view of a second embodiment of the conductive insert of the disclosed invention;

FIG. 13 is an end view of the second embodiment of the conductive insert of the disclosed invention;

FIG. 14 is a side elevational view of the second embodiment of the conductive insert of the disclosed invention; and FIG. 15 is a bottom view of the second embodiment of the conductive insert of the disclosed invention.

DETAILED DESCRIPTION OF THE PREFERRED EMBODIMENT

Figure 1:
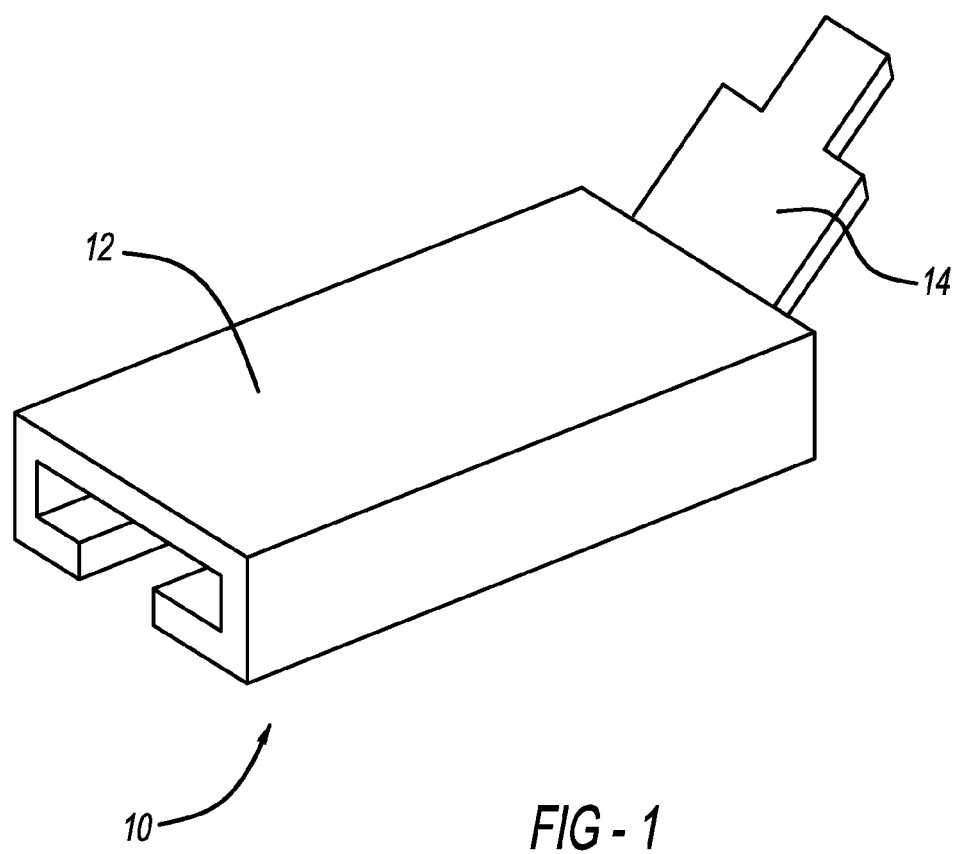
FIG. 1 is a perspective view of a connector according to the disclosed invention.

In the following figures, the same reference numerals will be used to refer to the same components. In the following description, various operating parameters and components are described for one constructed embodiment. These specific parameters and components are included as examples and are not meant to be limiting.

FIG. 1 illustrates a perspective view of the connector of the disclosed invention, generally illustrated as 10. The connector 10 includes a housing 12 and a conductive insert 14. The shape and general dimensions of the connector 10 as shown in FIG. 1 and throughout the various views are not intended as being limiting but instead are intended as being illustrative only.

The housing 12 may be composed of a variety of non-conductive, polymerized materials, including but not limited to ABS, polycarbonate and polypropylene. The conductive insert 14 may be composed of any one of several conductive materials, including metal or a metal-coated material. Non-limiting examples of such metals or metal coatings include copper and aluminum.

Figure 2:
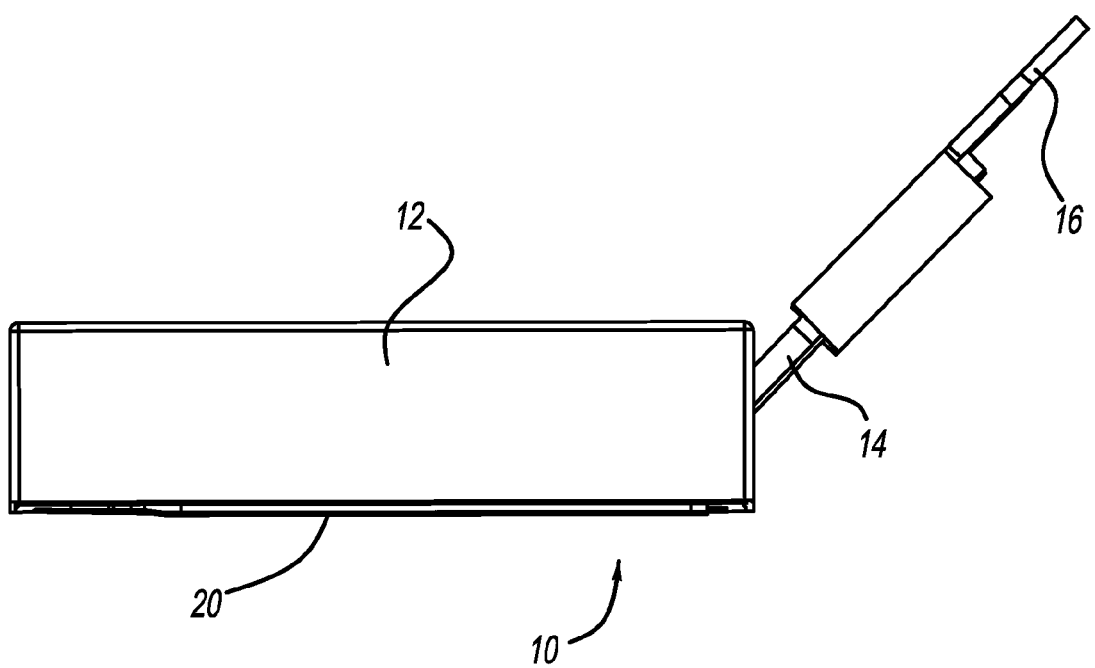
FIG. 2 is a side elevational view of the connector according to the disclosed invention.

FIG. 2 illustrates a side view of the connector 10. Attached to one end of the conductive insert 14 is a metal terminal 16 to which any of a variety of electric lines may be attached (not illustrated).

Figure 3:
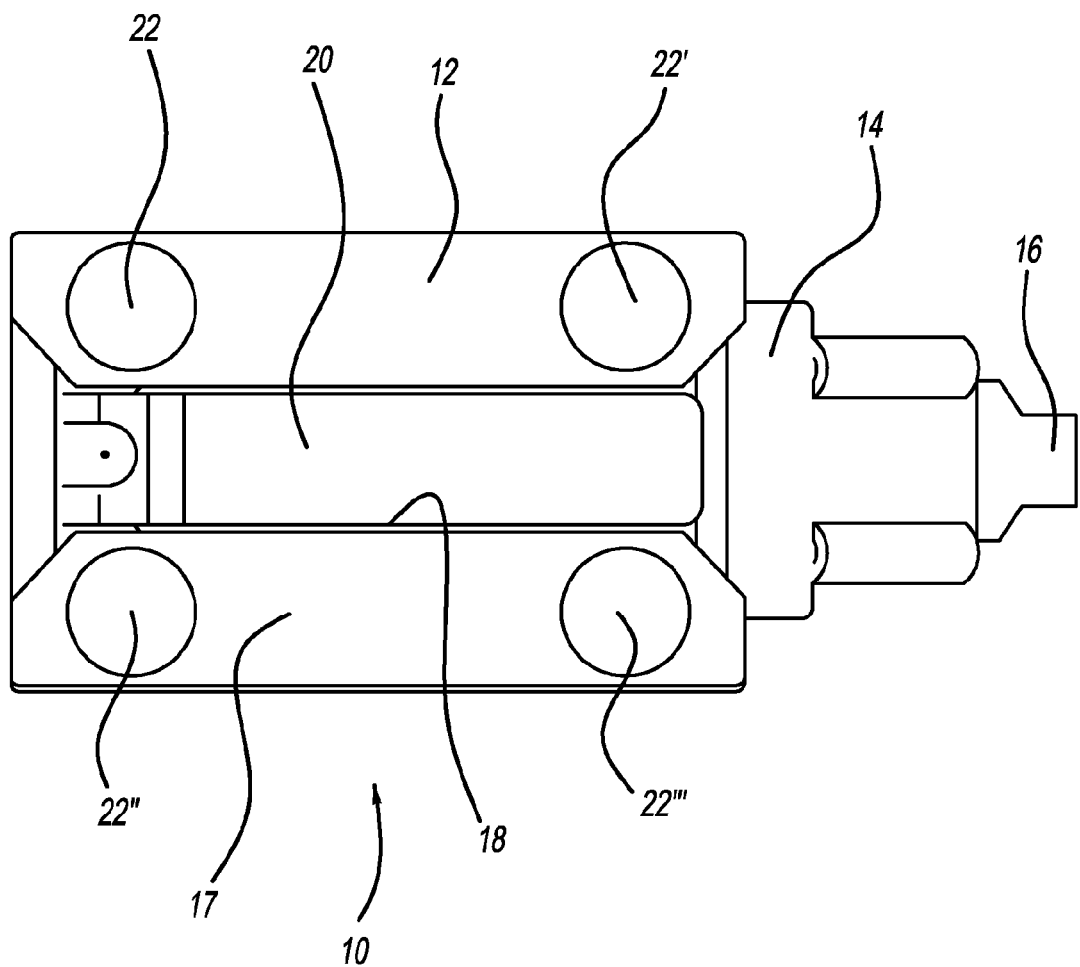
FIG. 3 is a bottom view of the connector according to the disclosed invention.
Figure 5:
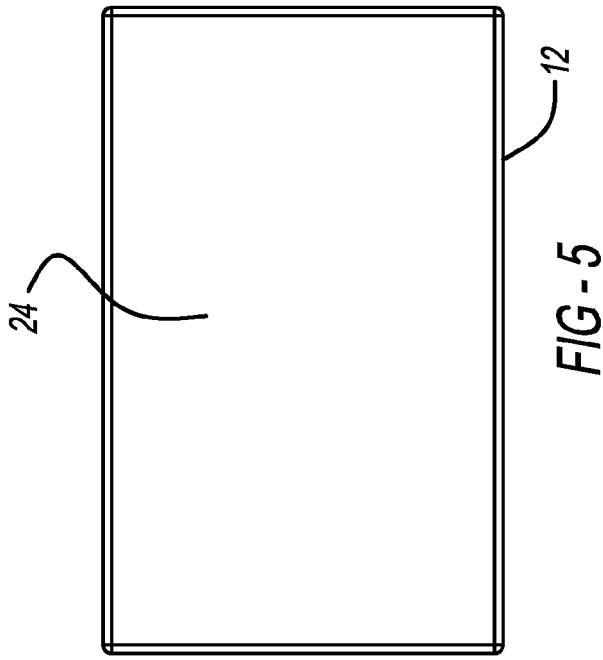
FIG. 5 is a top view of the connector housing according to the disclosed invention.
Figure 7:
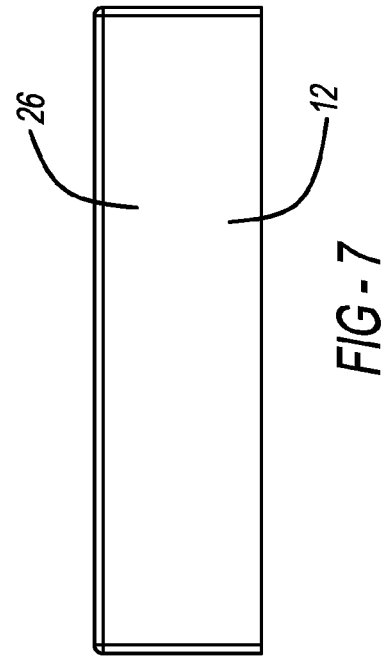
FIG. 7 is a side view of the connector housing according to the disclosed invention.
Figure 4:
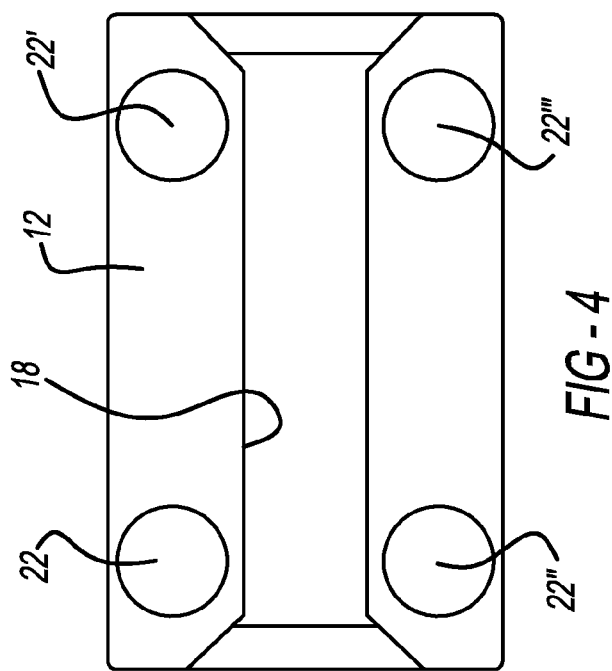
FIG. 4 is a bottom view of the connector housing according to the disclosed invention.

FIG. 3 illustrates an underside view of the connector 10. The underside of the housing 12 has an outer surface 17 and a slot 18. A contact portion 20 of the conductive insert 14 extends through the slot 18 and beyond the plane of the outer surface 17 of the underside of the housing 12 as illustrated in FIG. 1. It is the contact portion 20 of the conductive insert 14 that provides the necessary conductivity between the conductive insert 14 and its associated wire and the electrically conductive substrate provided for the rear window defroster or the radio antenna or a similar application.

One or more structural adhesives are provided to fixedly adhere the connector 10 to the glass (not shown). The selected structural adhesive must be easy to use and durable once applied. It must be capable of withstanding high heat generated by sunlight striking the glass. The mechanical retention force provided by the structural adhesive is sustained at temperatures above the solidus and liquidus temperature of the solder itself, specifically above 100° C. and more specifically at service temperatures exceeding 120° C. Among the many advantages offered by the disclosed invention is the ability to use a solder having a low melting point by separating the mechanical and conductive properties of the connection. Accordingly, if the solder joint becomes weakened due to softening or melting at elevated temperatures the mechanical integrity of the connection is not compromised. The solder itself can provide adequate conductivity through the joint even at temperatures at or near the liquidus temperature. When the temperature falls below the solidus the solder can then re-harden. This cycle can repeat numerous times over the life of the joint without deteriorating below the required performance levels described in SAE USCAR-40 Lead Free Solder Validation Test Plan Draft (October 2010).

A non-limiting example of one such structural adhesive is Raybond Techbond® PUR. This adhesive having low-temperature activation provides immediate bonding of heat sensitive plastics. It is a heat-cured, tack-free, one-component polyurethane structural adhesive for bonding heat sensitive substrates. Green strength is achieved in seconds allowing immediate handling of bonded assemblies.

As shown in FIG. 3, a plurality of adhesive tablets 22, 22', 22" and 22'" are attached to the outer surface 17 of the underside of the housing 12. The sizes, shapes, arrangement and number of adhesive tablets shown in FIG. 3 are suggestive and are not intended as being limiting.

Figure 6:
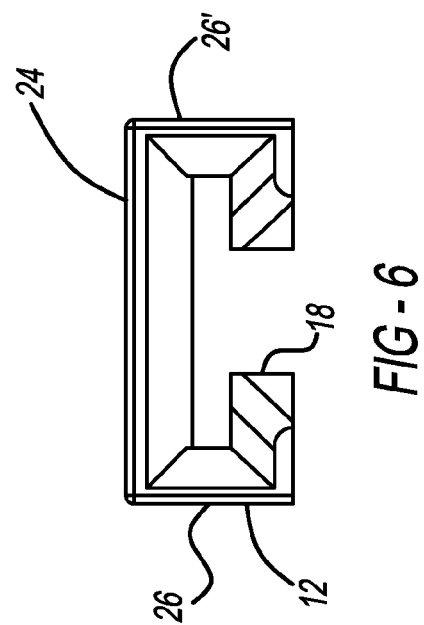
FIG. 6 is an end view of the connector housing according to the disclosed invention.

As shown in FIGS. 4 through 7, the housing 12 includes a top 24, a first side 26 and a second side 26'. An end view of the housing 12 is shown in FIG. 6. This end view may represent either end of the housing 12 as each end is a mirror image of the other. The slot 18 is more clearly illustrated in this view.

FIGS. 8 through 11 illustrate a first embodiment of the conductive insert 14. According to this embodiment solder is not needed at all as a compressive force is used to assure conductivity between the glass and the connector. FIGS. 12 through 15 illustrate a second embodiment of the conductive insert 14. According to this embodiment, solder is needed and provides the conductivity between the glass and the connector.

With respect to the first embodiment of the conductive insert 14 shown in FIGS. 8 through 11, the insert 14 includes a spade 28 for connection to a conduit as is known in the art, an intermediate portion 30, and the contact portion 20. A pair of opposed and spaced apart flanges 32 and 32' are provided to retain the conductive insert 14 inside the housing 12 once inserted therein.

To assure positive contact between the connector 10 and the glass to which it is attached, the first disclosed embodiment of the conductive insert 14 includes a skid 34. The skid 34 is preferably attached to the contact portion 20 at attachment point 36 and thus provides a compressive force against the underlying glass substrate. By not using solder according to the first embodiment of the conductive insert 14 the possibility of glass breakage due to thermal expansion mismatch between solder and glass can be completely eliminated.

With respect to FIGS. 12 through 15, the second embodiment of the conductive insert 14 is illustrated. The conductive insert 14 illustrated in these figures is identical to the conductive insert 14 illustrated in FIGS. 8 through 11 except for the absence of the skid 34 and the presence of a lead-free solder that functions to assure electrical conductivity between the glass and the connector in lieu of the compressive force provided by the skid 34.

Prior to insertion of the conductive insert 14 into the housing 12, at least the bare metal of the contact portion 20 of the conductive insert 14 is coated with a lead-free solder. The use of solder enhances the conductivity between the glass and the contact portion 20.

The liquidus temperature of the solder joint between the glass and the contact portion 20 and the very high service temperature limit of the adhesive are significantly dissimilar. Because of this significant dissimilarity, good conductivity between the glass and the contact portion 20 is assured regardless of glass temperature, even under the most extreme of conditions.

The foregoing discussion discloses and describes exemplary embodiments of the present invention. One skilled in the art will readily recognize from such discussion, and from the accompanying drawings and claims that various changes, modifications and variations can be made therein without departing from the true spirit and fair scope of the invention as defined by the following claims.

What is claimed is:

1. A connector for attachment to a vehicle surface for connecting an electrically conductive substrate to an electric conduit, the connector comprising:
   a housing composed of an electrically non-conductive material, said housing having an interior region and an underside, said underside having an outer surface and a slot formed therein, said housing having a top, a first side, a second side, a first open end and a second open end, said first open end being a mirror image of said second open end;
   an electrically conductive insert for at least partial placement into said interior region of said housing into either of said two open ends, said conductive insert having a contact portion, said contact portion extending at least partially through said slot of said housing; and
   adhesive provided on said underside of said housing for attachment of said housing to the vehicle surface.

2. The connector of claim 1 wherein said electrically conductive insert includes an upper portion and an intermediate portion connecting said upper portion to said contact portion, said electrically conductive insert at least partially defining a U-shape.

3. The connector of claim 1 wherein said electrically conductive insert includes a contact spade extending therefrom.

4. The connector of claim 2 wherein said upper portion of said conductive insert includes a pair of spaced apart and opposed flanges extending therefrom.

5. The connector of claim 1 wherein said adhesive is a heat activatable adhesive.

6. The connector of claim 1 wherein said adhesive is pre-applied to said housing.

7. The connector of claim 1 wherein said contact portion of said conductive insert includes a conductive skid extending therefrom.

8. The connector of claim 1 wherein at least said contact portion of said conductive insert is coated with lead-free solder.

9. A connector for attachment to a vehicle surface for connecting an electrically conductive substrate to an electric conduit, the connector comprising:
- a housing composed of an electrically non-conductive material, said housing having an interior region and an underside, said underside having an outer surface and a slot formed therein; said housing having a top, a first side, a second side, a first open end and a second open end, said first open end being a mirror image of said second open end;
- an electrically conductive insert for at least partial placement into said interior region of said housing into either of said two open ends, said conductive insert having a contact portion, said contact portion extending at least partially through said slot of said housing, said contact portion further including a conductive skid extending therefrom; and
- adhesive provided on said underside of said housing for attachment of said housing to the vehicle surface.

10. The connector of claim 9 wherein said electrically conductive insert includes an upper portion and an intermediate portion connecting said upper portion to said contact portion, said electrically conductive insert at least partially defining a U-shape.

11. The connector of claim 9 wherein said electrically conductive insert includes a contact spade extending therefrom.

12. The connector of claim 10 wherein said upper portion of said conductive insert includes a pair of spaced apart and opposed flanges extending therefrom.

13. The connector of claim 9 wherein said adhesive is a heat activatable adhesive.

14. The connector of claim 9 wherein said adhesive is pre-applied to said housing.

15. A connector for attachment to a vehicle surface for connecting an electrically conductive substrate to an electric conduit, the connector comprising:
- a housing composed of an electrically non-conductive material, said housing having an interior region and an underside, said underside having an outer surface and a slot formed therein, said housing having a top, a first side, a second side, a first open end and a second open end, said first open end being a mirror image of said second open end;
- an electrically conductive insert for at least partial placement into said interior region of said housing into either of said two open ends, said conductive insert having a contact portion, said contact portion extending at least partially through said slot of said housing, at least a portion of said contact portion being coated with lead-free solder; and
- adhesive provided on said underside of said housing for attachment of said housing to the vehicle surface.

16. The connector of claim 15 wherein said electrically conductive insert includes an upper portion and an intermediate portion connecting said upper portion to said contact portion, said electrically conductive insert at least partially defining a U-shape.

17. The connector of claim 15 wherein said electrically conductive insert includes a contact spade extending therefrom.

18. The connector of claim 17 wherein said upper portion of said conductive insert includes a pair of spaced apart and opposed flanges extending therefrom.

19. The connector of claim 15 wherein said adhesive is a heat activatable adhesive.

20. The connector of claim 15 wherein said adhesive is pre-applied to said housing.

* * * * *